United States Patent
Kontaras et al.

(10) Patent No.: US 10,692,691 B2
(45) Date of Patent: Jun. 23, 2020

(54) PULSE PROCESSING

(71) Applicant: FEI Company, Hillsboro, OR (US)

(72) Inventors: Nikolaos Kontaras, Eindhoven (NL); Bart Jozef Janssen, Eindhoven (NL); Cornelis Sander Kooijman, Veldhoven (NL); Duarte Guerreiro Tome Antunes, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/522,308

(22) Filed: Jul. 25, 2019

(65) Prior Publication Data
US 2019/0362932 A1 Nov. 28, 2019

Related U.S. Application Data

(63) Continuation of application No. 15/053,898, filed on Feb. 25, 2016, now Pat. No. 10,403,470.

(30) Foreign Application Priority Data

Feb. 26, 2015 (EP) .................................. 15156716

(51) Int. Cl.
*H01J 37/244* (2006.01)
*G01T 1/17* (2006.01)
*H01J 37/28* (2006.01)

(52) U.S. Cl.
CPC .............. *H01J 37/244* (2013.01); *G01T 1/17* (2013.01); *H01J 37/28* (2013.01); *H01J 2237/22* (2013.01)

(58) Field of Classification Search
CPC ...... H01J 37/244; H01J 37/28; H01J 2237/22; G01T 1/17
See application file for complete search history.

(56) References Cited

U.S. PATENT DOCUMENTS

| | | | | |
|---|---|---|---|---|
| 2008/0215267 A1* | 9/2008 | Eglin | ........................ | G01T 1/17 702/66 |
| 2013/0277555 A1* | 10/2013 | Kooijman | ............... | G06F 17/18 250/336.1 |
| 2014/0114596 A1* | 4/2014 | Kobayashi | ................ | G01T 1/17 702/64 |

OTHER PUBLICATIONS

Liszka et al. ("Extraction of a deterministic component from ROSAT X-Ray data using wavelet transform and the principal component analysis," Astron. Astrophys. Suppl. Series 140, pp. 125-134, 1999) (Year: 1999).*

* cited by examiner

*Primary Examiner* — Yasser A Abdelaziez

(57) ABSTRACT

The invention relates to a method for analyzing an analogue signal comprising randomly spaced events having an event height. The method includes irradiating a sample with a focused beam of energetic electrons, detecting emission from the sample in response to such irradiation, and converting an analog signal of the emissions to a stationary time signal. The method further includes determining an estimated noise contribution for the stationary time signal, and determining an estimated event height of an event based on the stationary time signal and the estimated noise contribution for the stationary time signal, and determining, based on the estimated event height, an energy of the emission detected by the detector. This method is particularly useful for X-ray detectors, such as Silicon Drift Detectors, used in a SEM. By estimating the noise contribution to the signal, the step height is estimated with improved accuracy.

20 Claims, 4 Drawing Sheets

Figure 1A:
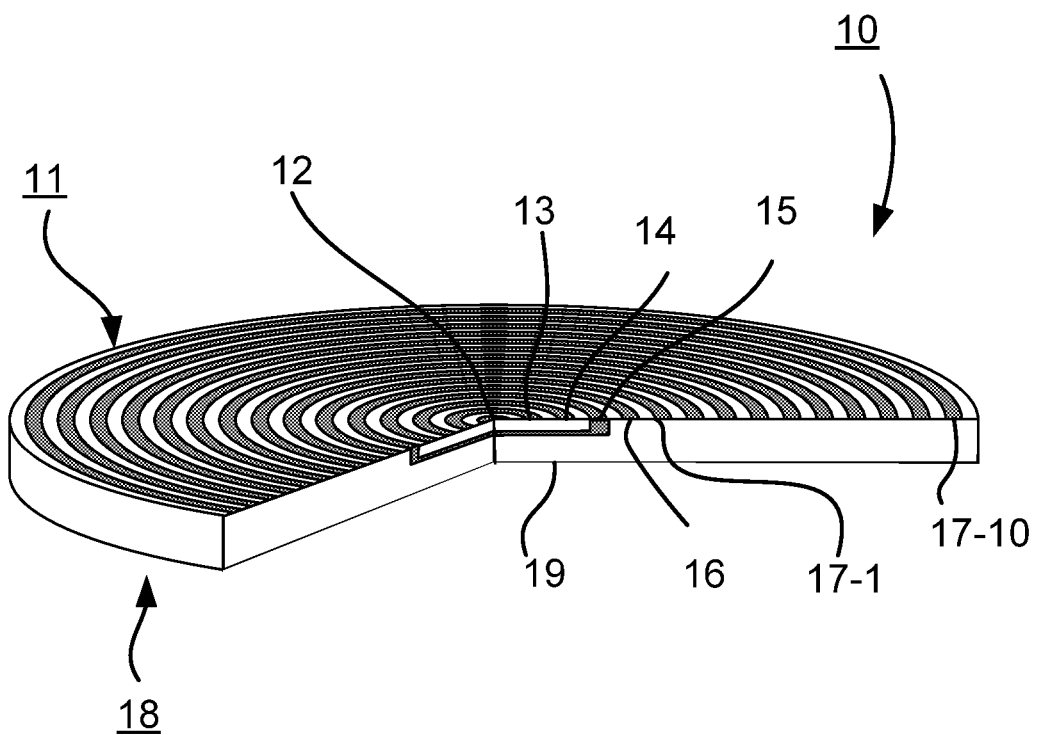

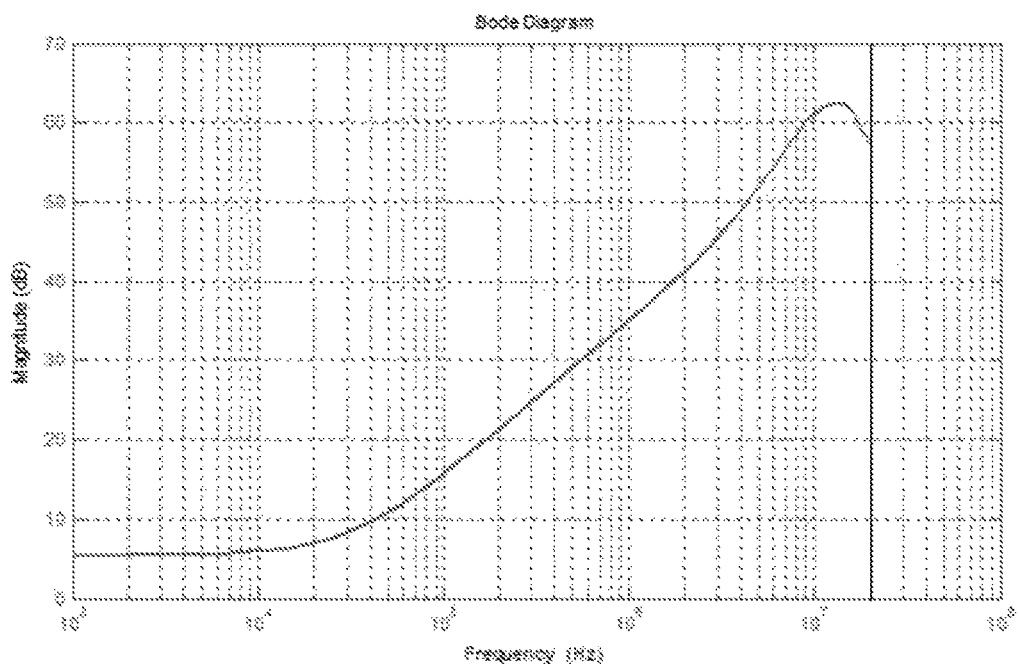
FIG. 5
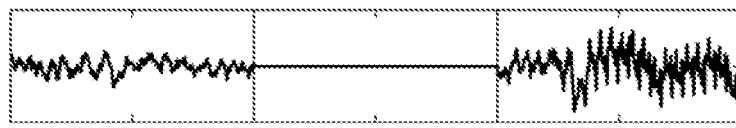
FIG. 6ᵃ
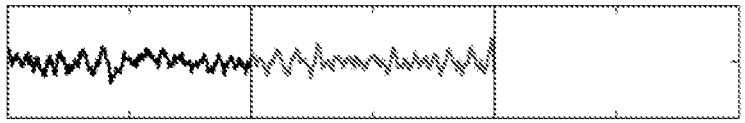
FIG. 6ᵇ
FIG. 6ᶜ
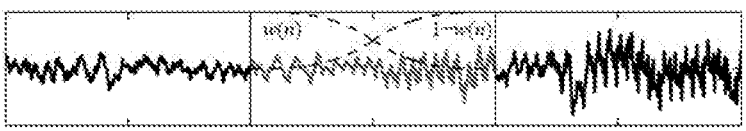
FIG. 6ᵈ

PULSE PROCESSING

The invention relates to a method for analyzing an analogue signal comprising randomly spaced steps, the method comprising:
- converting the signal to a series of samples S(t), with t the moment of sampling, thereby forming a sampled, discrete time signal,
- detecting the presence of a step, the step detected at t=T,
- estimating the step height using a number of samples preceding the step and a number of samples following S(T).

The invention further relates to an apparatus equipped to perform the method.

When an X-ray photon or an electron hit a semiconductor detector, a number of electron-hole pairs are generated in the detector. By biasing the detector, either by an externally applied voltage or by a build-in internal field due to doping of the semiconductor material, the electrons are attracted to the anode or the holes are attracted to the cathode. This results in a pulse. This pulse can be detected, preferably after first amplifying the signal, for example with a FET amplifier. By now detecting the pulse height the energy of the X-ray photon or electron can be determined. As known to the skilled person the energy of an X-ray photon is an indication of the element that emitted said photon.

European patent application no. EP2653892A1 describes a method for analyzing the signal of a Silicon Drift Detector (SDD) for X-ray detection in a charged particle apparatus. The signal is analyzed to detect steps, estimating the level of the signal before each step and after each step and using these estimates estimating the step height by subtracting the two levels from each other. The level before each step is estimated by averaging (integrating) the signal over time: the longer the averaging, the lower the variance in the signal. However, the maximum integration time is limited to avoid noise contributions stemming from low-frequency noise, leakage, etc.

It is noted that the steps are the result of the (analogue) integration of pulses by the FET amplifier.

Another such method is known from U.S. Pat. No. 7,966,155B2.

This US patent a method comprising converting the signal to a series of samples, detecting the presence of a step, estimate the signal level before the step and after the step by filtering the signal by using a switchable integrator, and estimating the step height by subtracting the two levels from each other. The integration time of the two integrators is selectable dependent on the time period between said pulse and the preceding and following pulses.

It is known that an X-ray photon or an electron can be detected in, for example, a semiconductor device (assuming the photon or electron is sufficiently energetic). Both the method described in the EP patent application and in the US patent can be used to determine the energy of an X-ray photon detected in a semiconductor device (for example a SDD) or a Geiger-Müller device, or to detect the energy of an electron detected in a semiconductor detector.

Both the method described in the EP patent application and in the US patent try to determine the signal levels before and after an event as good as possible. If the time between events is small, the variance of the estimates of the signal level between the events is high due to signal-to-noise problems. Noise sources of a signal of a (FET) amplifier can be: series noise, parallel noise and 1/f at the amplifier input, and in the case of X-ray and electron detectors Fano noise due to the uncertainty of the number of electrons generated in an event (incoming photon or electron).

Both the method described in the EP patent application and in the US patent give a less reliable value for the event height when the time between events decreases. For both methods operating at high count rate is therefore coupled to less reliable values for the event height.

There is a need for a method allowing more reliable estimation of the event height at a high count rate.

To that end the method according to the invention is characterized in that
a model is used to estimate a noise contribution N(t) for $t=(T-\Delta_1)$ tot$=(T+\Delta_2)$, the noise contribution derived from samples S(t) with $t \leq (T-\Delta_1)$ and/or samples S(t) with $t \geq (T+\Delta_2)$, with $\Delta_1$ and $\Delta_2$ predetermined or preset time periods, $\Delta_1$ having a value such that the event has a negligible contribution to samples taken before $(T-\Delta_1)$ and $\Delta_2$ having a value such that the event has a negligible contribution to samples taken after $(T+\Delta_2)$,
the event height E is estimated by integrating the series of samples from $(T-\Delta_1)$ to $(T+\Delta_2)$ minus the noise contribution for said samples, $$E\Sigma_{t=(T-\Delta_1)}^{t=(T+\Delta_2)} S(t) - \Sigma_{t=(T-\Delta_1)}^{t=(T+\Delta_2)} N(t) =_{t=(T-\Delta_1)}^{t=(T+\Delta_2)} [S(t) - N(t)].$$

The invention is based on the insight that the noise during the time interval that the event occurs can, at least partly, be estimated from samples following and/or preceding the event. By integrating the signal over the period that the event occurs and subtracting the noise from it, a more accurate estimate of the event height is made. In other words: the invention is based on the (inventive) use of the correlation in the noise.

A non-exhaustive list of signal sources is:
- a silicon x-ray detector (such as a PIN diode or a SSD) for detecting X-rays,
- an electron detector for use in a particle-optical apparatus,
- an acoustic detector such as a microphone for detecting, for example, sonic 'booms'
- a hydrophone for detecting, for example, 'pings' from electronic devices such as the black boxes of airplanes,
- a seismic detector,
- a superconducting bolometer for detecting radiation,
- a scintillation detector.

The signal may be sampled by a sample&hold device to be processed in a device using a bucket-brigade-delay-line, or by passing it through an analogue-digital converter for processing in the digital domain.

Before the signal is sampled, it may be filtered. By for example differentiating the signal the dynamic range of the signal to be sampled is reduced. As a result an improved signal representation can be achieved. By for example integrating aliasing is avoided.

The event may be a pulse in the signal, or a step on the signal, or an edge followed by a decay time. If it is known that the signal is a convoluted signal, the signal may be deconvoluted either before sampling (using for example electrical integrators and/or differentiators) or by passing the sampled signal through a filter.

The noise prediction model may comprise: linear interpolation, extrapolation, autoregressive modeling (AR modeling), ARMA modeling, or a method based on linear optimum gap interpolation.

The modeling may be a modeling using a fixed set of parameters (for example using fixed values for $\Delta_1$ and $\Delta_2$), or may use a variable set of parameters, for example using values for $\Delta_1$ and $\Delta_2$ that depend on the time of earlier noise (the signal before t=T).

It is noted that the number of samples may depend on the moment of time that a previous or following event occurs: when the period is small, only a small number of samples is used, while for long periods the number of samples may be limited to a maximum number.

In an aspect of the invention an apparatus is equipped with an X-ray or secondary electron detector and a programmable processor for processing the data of said detector, the processor programmed to perform any of the preceding methods.

This aspect describes a charged particle apparatus, for example a Scanning Electron Microscope (SEM) or an apparatus using an X-ray source, equipped with, for example, a SDD and a processor for processing the signal produced by the detector.

In an embodiment the charged particle apparatus in which a sample is irradiated is an apparatus where a focused beam of energetic electrons irradiates the sample, in response to which X-rays and/or secondary electrons are emitted by the sample to be detected by the detector.

It is well-known that X-ray analysis of a sample can be done in a SEM using a beam energy of, for example, 10 keV or more.

Figure 1B:
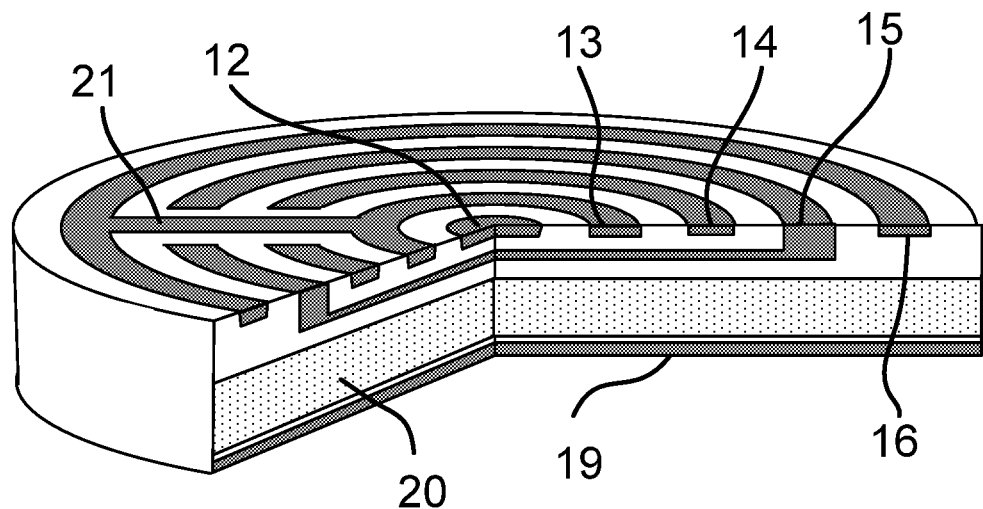
Figure 2:
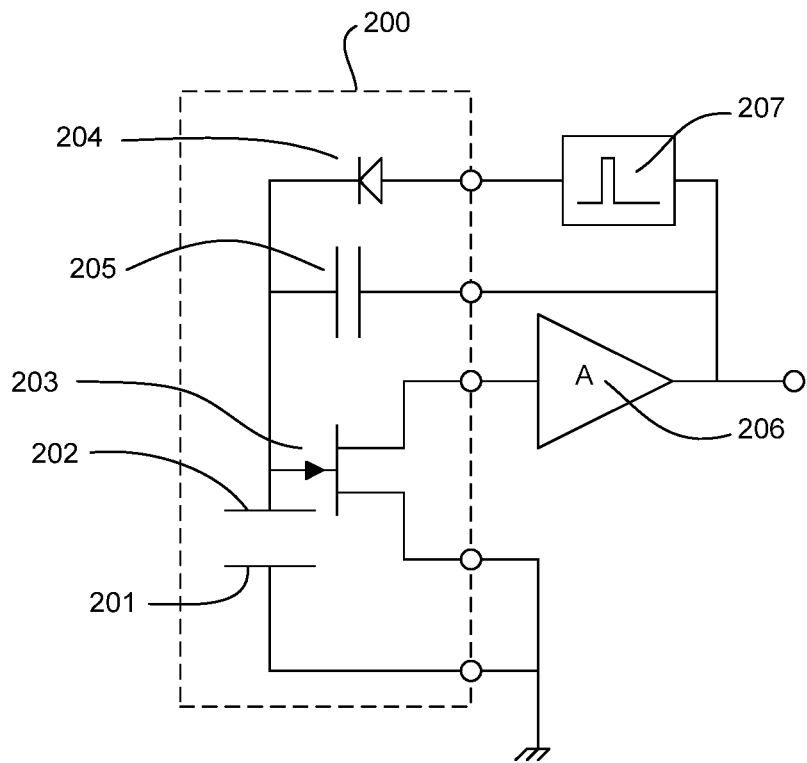
Figure 3:
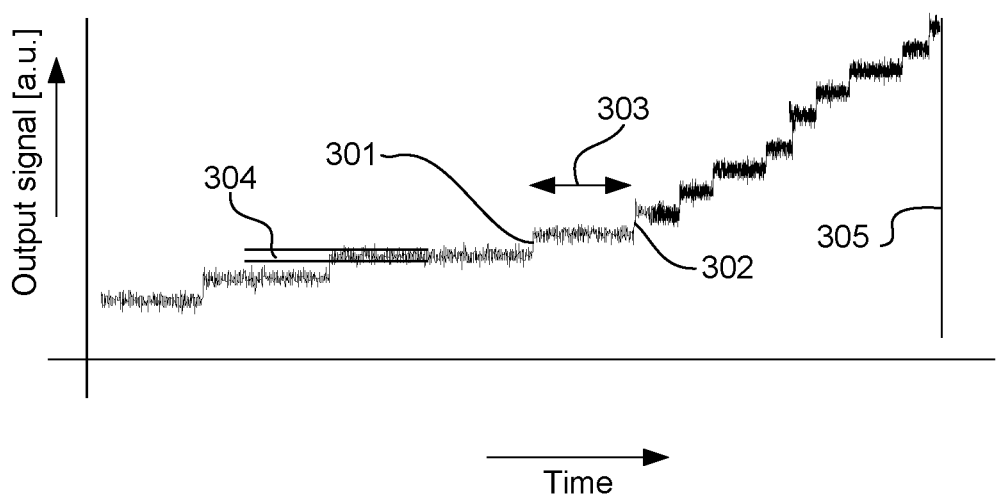
Figure 4:
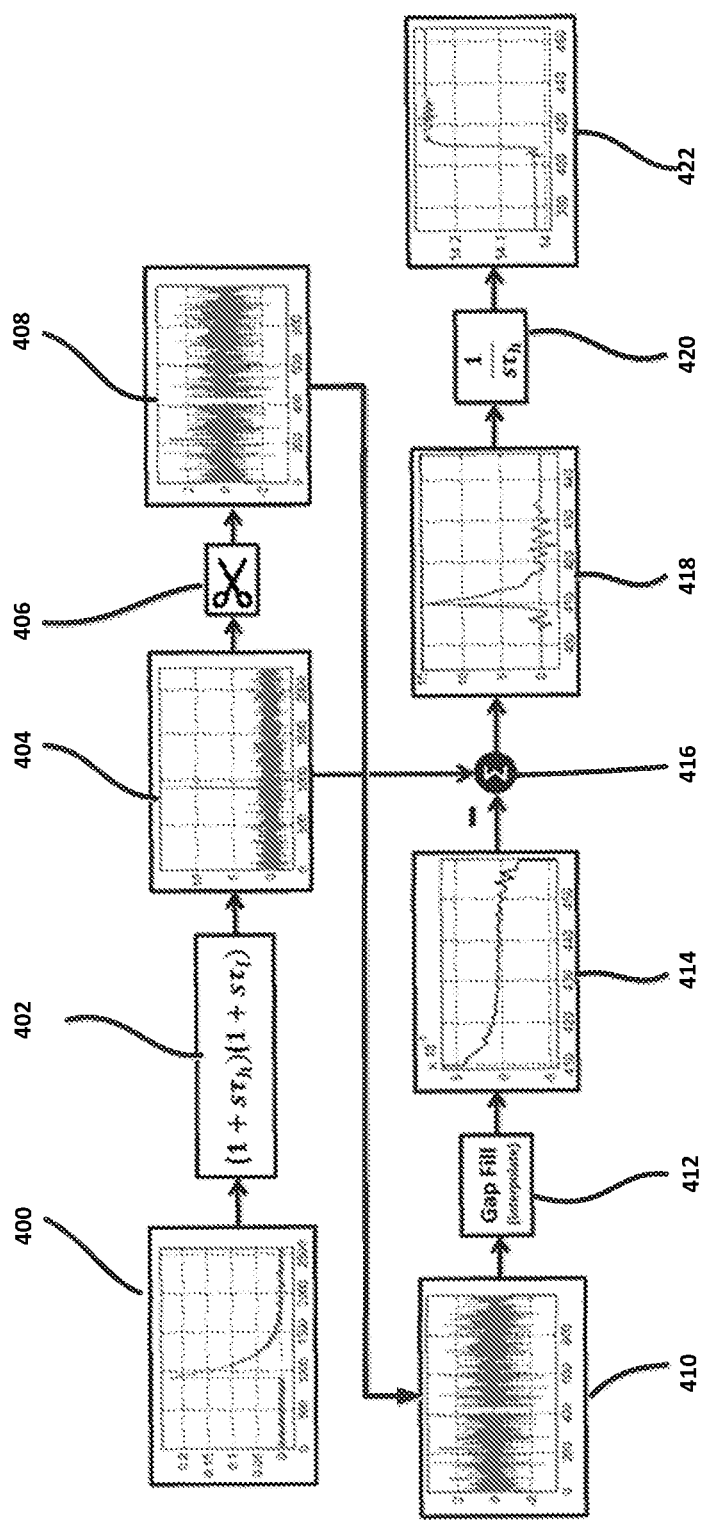

The invention is now elucidated using figures in which identical reference numerals refer to corresponding features. To that end:

FIG. 1A schematically shows a SDD;

FIG. 1B schematically shows a detail of FIG. 1A;

FIG. 2 schematically shows an electrical scheme of a FET amplifier part of the SDD;

FIG. 3 schematically shows the output signal of the SDD after the charge amplifier;

FIG. 4 schematically shows a workflow according to the method;

FIG. 5 schematically shows a Bode plot of an ARMA model; and

FIG. $6^a$-$6^d$ schematically show how the signal can be interpolated.

FIG. 1A schematically shows a SDD.

A SDD is a silicon wafer (or part thereof) 10, showing a volume of high purity, or at least showing little recombination sides, between a first side 11 and a second side 18. Side 11 comprises the anode 16 and side 18 comprises the cathode 19. Electrodes of any electron/hole pairs generated in the volume between these two sides will drift to the anode and the holes to the cathode(s). Side 11 shows at a first side 11 a central electrode 12 forming the drain of a FET. An electrode 13 surrounding the central electrode forms the gate of the FET, and electrode 14 surrounding electrode 13 forms the source of the FET. The FET is shielded from the rest of the silicon wafer by a shield electrode 15 surrounding electrodes 12, 13 and 14, both laterally and 'inside' the wafer. The anode is connected to the gate of the FET (connection not shown in FIG. 1A).

Surrounding the anode a number of concentric electrodes 17-$i$ are formed. The innermost of these concentric electrodes is connected to a voltage close to the anode voltage, the successive rings 17-$i$ connected to voltages increasing from slightly above the anode voltage for the innermost of these electrodes to a voltage close to or equal to the cathode voltage for the outermost electrode. The ring electrodes 17-$i$ cause a field inside the wafer that guides all the electrons from the electron/hole pairs to the anode, the anode being only a small structure and thus showing only a small capacitance with respect to the cathode. It is noted that, in working, a voltage difference is applied between the anode and the cathode. Hereby the capacitance of the anode with respect to the cathode is reduced. SDDs with an anode capacitance of 0.15 pF in working are commercially available.

FIG. 1B schematically shows a detail of the SDD shown in FIG. 1A. FIG. 1B shows the part from the center until the anode. Here the connection between anode 16 and the gate of the FET is schematically shown as a metallization 21 Side 18 is the side sensitive to radiation. Underneath this surface the sensitive volume 20 is shown. X-rays incident on the sensitive surface penetrate into the volume and generate in this volume a number of electron/hole pairs. The amount of electron/hole pairs depends on the energy of the photon. In normal operation the number of photons is such, that each event can be detected separately, and thus the number of electron/hole pairs per event, that is: per incident photon. Charge accumulates on the anode forcing the voltage of the anode to become more and more negative (with respect to the cathode) until a reset of the anode is caused by resetting the anode with, for example, a reset diode (not shown). Alternatively leakage current from the drain of the FET to its gate can be used to compensate for the average charge accumulation.

It is noted that often a feedback capacitor is integrated on the SDD, connecting the anode to an output, but that this capacitor can also be placed outside the SDD.

FIG. 2 schematically shows an electronic representation of a (part of a) SDD.

The electronic representation shows the SDD used in a charge amplifier configuration. The parts within box 200 are part of the SDD wafer as shown in FIGS. 1A and 1B, the other parts are external to the SDD wafer.

The SDD comprises a cathode 201 and an anode 202, a FET 203 of which the gate is internally connected to the anode 202, a feedback capacitor 205 of which one side is connected to the anode 202, and a reset element in the form of diode 204 of which the cathode is connected to the anode 202. Connected to outputs of the SDD are its cathode, the source and drain of the FET, the side of the feedback capacitor not connected to the anode 202, and the anode of the reset diode. The external connections of the cathode 201 and the source of the FET are tied together to ground potential. The drain of the FET is connected to an amplifier 206. The output of the amplifier is connected to the feedback capacitor on the SDD and thus a charge amplifier is formed. Further reset logic 207 is connected to the output of the amplifier, which produces a pulse to the anode of the reset diode, as a result of which the SDD is reset.

It is mentioned that, when the FET is used as a source follower, and where the voltage between drain and gate $V_{dg}$ varies, the detector can operate in so-called "continuous reset mode", in which the reset logic is not active, or not even present, and the drain/gate voltage of the FET generates a (voltage dependent) leakage current that compensates the induced (average) anode/cathode current.

Not shown, but necessary for operating the detector, are electronics for biasing the anode 202, the drain of the FET, and the concentric rings 17-$i$. It is noted that the voltages for the concentric rings can be derived from a resistive network integrated on the SDD between its anode and its cathode.

It is noted that the output of the amplifier is connected to further electronics and logic to determine the pulse height of the charge amplifier resulting from an incident photon.

In Application note AN-SDD-003: Amptek Silicon Drift Detectors (http://www.amptek.com/pdf/ansdd3.pdf), more specifically in FIG. 10 and associated text, the noise of this circuit is discussed.

FIG. 3 schematically shows the output signal of the SDD after the charge amplifier (206 in FIG. 2).

The output signal, typically a voltage, shows a number of steps, for example steps 301 and 302, separated by an interval, for example interval 303. These steps are the result of a photon impinging on the diode. The height of the step varies, and is a measure for the energy of the photon. Clearly visible is the noise on the signal between the steps, with a peak-to-peak value 304. It is further shown that, when the signal exceeds a predetermined level, the charge amplifier is reset, resulting in a drop of the signal 305.

FIG. 4 schematically shows the method according to the invention.

In the boxes showing horizontal and vertical axis, the horizontal axis schematically shows the time axis, the vertical axis schematically shows the amplitude of the signal.

Box 400 shows the signal shown in FIG. 3 after filtering, in this case differentiating (high-pass filtered). The filtering lowers the dynamic range of the signal to slightly more than the dynamic range of one step (event), and thus lowers the constraint on the ADC sampling the signal.

Box 402 shows sparsification of the (sampled) signal, resulting in a (temporally) compressed signal shown in box 404. This specific sparsification step, a filter operation that in this specific case compresses the signal temporally, is not essential to the invention, but results in an improved performance of the algorithm.

Box 404 shows the compressed signal after the filtering action shown in box 402, the signal split in two streams: one stream going to box 406 and one to summing node 416. In this compressed signal the pulse is clearly detectable, detected at moment t=T.

Box 406 schematically shows the action where part of the data surrounding the pulse, the data from $t=(T-\Delta_1)$ to $t=(T+\Delta_2)$, is deleted.

Box 408 schematically shows the data stream after deleting the data from $t=(T-\Delta_1)$ to $t=(T+\Delta_2)$. It is noted that this data only comprises noise, as any signal to which the pulse significantly contributes is deleted (indicated by the scissors of box 406).

Box 410 shows the identical box as box 408 for convenience.

Box 412 schematically shows the action of determining what data to use for the interpolation in the gap, find interpolated and/or extrapolated data using said data to use for the interpolation and a model, and then fill the gap with the thus found data. This box schematically shows the result of an interpolation action based on a model using data-present in the data S(t) using samples sampled before $t=(T-\Delta_1)$ and/or after $t=(T+\Delta_2)$.

Box 414 shows an example of data retrieved by the action of box 412. This is thus an estimate of the noise contribution N(t) in the gap.

Box 416 shows that the noise contribution N(t) is subtracted from the signal S(t) for $t=(T-\Delta_1)$ to $t=(T+\Delta_2)$.

Box 418 is the result of the subtraction, and represents an estimate of the pulse of box 404 minus the noise contribution shown in box 414.

Box 420 schematically shows a filtering (integration) of the signal of box 418.

Box 422 shows the resulting signal after the filtering of box 420. From this signal the step height can be derived.

The method described here is based on a transformation of the input signal such that it can easily be split in a signal component (an x-ray detection component) and a stationary correlated noise component. This correlated noise component is subsequently used to improve the prediction of the energy content of the x-ray detection component.

The key to and a novelty of the method described here is that the transformed signal is stationary. This in contrast with for example the earlier mentioned method described in EP2653892A1 pulse processor mentioned above. This allows us to "train" a fixed model (box 412) that is able to make a prediction, based on adjacent noise components, of the noise that is present in the x-ray detection components. Subtraction of the predicted noise component from the x-ray detection component improves the resolution of the x-ray spectrum. We note that, because the model is trained based on system specific data, system imperfections that induce noise correlations are automatically compensated for.

FIG. 5 schematically shows a Bode plot of an ARMA model, said model used to estimate the noise contribution in the gap. The ARMA model may be trained with the noise signal before the pulse occurred. Preferably it is trained on a-priori knowledge of the noise, most preferably off-line. It is noted that the training results (the model to be used) depend on noise properties of electronics, the dynamics of the signal (for example the width of the signal), etc. Therefore best results are obtained when a model is trained for each detector and using a signal as representative for a real signal as possible (or, better: with many samples as representative as possible).

FIG. $6^a$-$6^d$ schematically show how the signal can be interpolated.

Using this ARMA model and the signal surrounding the gap (shown in FIG. $6^a$), an estimate based on the data-preceding the pulse (schematically shown in FIG. $6^b$) and an estimate based on data following the pulse (schematically shown in FIG. $6^c$) is determined, and using weight factors these two estimates are summed to form the estimate of the noise signal as shown in FIG. $6^d$.

It is noted that the before mentioned ARMA modeling can thus result in a method where the model is constantly changed, and thus the model can trained for optimum performance.

It is further noted that the before mentioned ARMA modeling is only one example of many implementation that can be used.

Best results are obtained when the optimum model is used for the noise. This is best done by "training" the model until said optimum (or a solution close to that) is found. Inventors found a training method that was of special interest for this invention: the linear optimum gap interpolation (LOGI). LOGI uses a signal without events (steps), and defines a left part, a middle part and a right part. The middle part has a similar length (time or number of samples) as the part that is taken out in box 408 or FIG. $6^a$. The trick is now to find a solution that, using the left and the right parts, forms a reconstruction of the middle part that deviates as little as possible from the actual middle part. Training is best done using a large number of realistic samples.

Mathematically this is expressed as follows:

Assume the (sampled) signal is denoted as a vector $x_{1 \ldots m}$, $x_{m+1 \ldots k}$ and $x_{k+1}$ representing the left, middle and right interval (part/segment) respectively. Denoting vector y as the known (concatenated) intervals, and s the unknown interval, the optimum gap interpolator W in the least mean square sense is an (m+n)·k matrix given by minimizing $$J = \mathbb{E}\|s - W^T y\|^2$$

Differentiation of this equation with respect to the elements of W and equating to zero, the solution to this problem satisfies:

$$\underbrace{\mathbb{E} y y^T}_{\Sigma} W = \underbrace{\mathbb{E} s y^T}_{Q}$$

It can be seen that $\Sigma$ is the autocorrelation matrix of y, and Q is a (m+n)·k matrix which relates each of the k unknown sample values to the available measurements contained in y. With $R_n$ the autocorrelation function of $x_i$, the structure of the two matrices then expands to:

$$\Sigma = \begin{pmatrix} R_0 & \cdots & R_{m-1} & R_{m+k} & \cdots & R_{m+k+n-1} \\ \vdots & \ddots & \vdots & \vdots & \ddots & \vdots \\ R_{m-1} & \cdots & R_0 & R_{k+1} & \cdots & R_{m+k} \\ R_{m+k} & \cdots & R_{k+1} & R_0 & \cdots & R_{n-1} \\ \vdots & \ddots & \vdots & \vdots & \ddots & \vdots \\ R_{m+k+n-1} & \cdots & R_{m+k} & R_{n-1} & \cdots & R_0 \end{pmatrix}$$

and $$Q = \begin{pmatrix} R_m & R_{m+1} & \cdots & R_{m+k-1} \\ \vdots & \vdots & & \vdots \\ R_1 & R_2 & \cdots & R_k \\ R_k & R_{k-1} & \cdots & R_1 \\ \vdots & \vdots & & \vdots \\ R_{k+n-1} & R_{k+n-2} & \cdots & R_n \end{pmatrix}$$

The thus found estimators are defined (dependent) by the dynamics of the noise and the lengths of the known and unknown intervals.

Using the matrix $\Sigma$ for the left part of the formula, and the matrix Q for the right part, this reduces to $$W = \Sigma^{-1} Q$$

The interpolation for pulse (event) j is given (predicted) by:

$$\hat{s}^j = W_{k,m,n}^T y^j$$

It is noted that, although the memory requirements for LOGI are much higher than the requirements for ARMA modelling, the required memory can be dramatically reduced by sparsification of the data.

It is further noted that other methods/models that can be used for the interpolation are described in handbooks such as:

Box, G. et al., "Time Series Analysis: Forecasting & Control", 4th edition, Wiley, ISBN. ISBN: 978-0-470-27284-8.

Hyndman, R. et al., (2014). "Forecasting: principles and practice", OTexts (Oct. 17, 2013) ISBN-10: 0987507109.

The invention claimed is:

1. A method for determining energy of X-ray photons or electrons detected by a charged particle apparatus, the method comprising:
   irradiating, by the charged particle apparatus, a sample with a focused beam of energetic electrons;
   detecting, by a detector, two or more X-rays and/or secondary electrons emitted by the sample in response to irradiating the sample specimen with the focused beam of energetic electrons, wherein detecting the two or more X-rays and/or secondary electrons comprises generating an analog signal comprising one or more randomly spaced events, each event of the one or more randomly spaced events having a corresponding event height;
   converting, by a programmable processor, the analog signal to a stationary time signal that corresponds to a series of samples;
   determining, by the programmable processor, a presence of an event of the one or more randomly spaced events within the stationary time signal, wherein the event corresponds to an X-ray photon or secondary electron of the two or more X-rays and/or secondary electrons emitted by the sample that were detected by the detector;
   determining, by the programmable processor, an estimated noise contribution for the stationary time signal by applying a noise prediction model to at least a portion of the stationary time signal, wherein the noise prediction model is configured to derive the estimated noise contribution for the stationary time signal from one or both of (1) a first set of one or more portions of the stationary time signal that temporally precede the event, and (2) a second set one or more portions of the stationary time signal that temporally follow the event;
   determining, by the programmable processor, an estimated event height of the event based on the stationary time signal and the estimated noise contribution for the stationary time signal; and
   determining, by the programmable processor and based on the estimated event height, an energy of the X-ray photon or electron detected by the detector.

2. The method of claim 1, further comprising forming a compressed signal by performing a sparsification operation on the stationary time signal that causes the event to be temporally compressed such that more samples are available for estimating noise contribution between events.

3. The method of claim 2, wherein performing the sparsification operation comprises filtering the signal with a discrete-time transformation of a continuous-time transfer function.

4. The method of claim 2, wherein the compressed signal has a form resembling a Dirac delta function.

5. The method of claim 1, wherein the event comprises a pulse in the stationary time signal, and wherein the event height corresponds to the height of the pulse.

6. The method of claim 1, wherein determining the estimated event height comprises integrating at least a part of the stationary time signal which includes the event minus the estimated noise contribution for the stationary time sample.

7. The method of claim 5, wherein the event comprises a step in the stationary time signal between a first value and a second value, and wherein the event height corresponds to a difference between the first value and the second value.

8. The method of claim 1, further comprising training the noise prediction model using a priori noise information representative of one or more noise properties of the charged particle apparatus.

9. The method of claim 1, wherein one or both of the first set of one or more portions of the stationary time signal, and the second set one or more portions of the stationary time signal are determined using a fixed set of parameters.

10. The method of claim 9, wherein the fixed set of parameters comprises temporal relationships to the event.

11. The method of claim 1, wherein one or both of the first set of one or more portions of the stationary time signal, and the second set one or more portions of the stationary time signal are determined based on a time between the event and an earlier event and/or a time between the event and a following event and/or form of the event.

12. The method of claim 1, wherein one or both of the first set of one or more portions of the stationary time signal, and the second set one or more portions of the stationary time signal are selected such that the event has a negligible contribution to them.

13. The method of claim 1 in which, before the analog signal is converted to the stationary time signal, the analog signal is filtered.

14. The method of claim 1, wherein the noise prediction model comprises interpolation, autoregressive (AR) modeling, ARMA modeling, or Linear Optimum Gap Interpolation, or combinations thereof.

15. The method of claim 1, further comprising determining compositional information about the sample specimen based on the energy of the X-ray photon or electron detected by the detector.

16. The method of claim 1, further comprising determining, by the programmable processor and based on the energy of the X-ray photon or electron detected by the detector, an element that emitted said X-ray photon or electron detected by the detector.

17. A system for detecting energies of X-ray photons and/or electrons, the system comprising:
a detector configured to generate an analog signal comprising one or more randomly spaced events, each event of the one or more randomly spaced events corresponding to an X-ray or secondary electron detected by the detector;
one or more programmable processors; and
a memory storing non-transitory computer readable instructions that, when executed on the one or more programmable processors, cause the system to:
convert the analog signal to a stationary time signal that corresponds to a series of samples;
determine a presence of an event of the one or more randomly spaced events within the stationary time signal;
determine an estimated noise contribution for the stationary time sample by applying a noise prediction model to at least a portion of the stationary time signal, wherein the noise prediction model is configured to derive the estimated noise contribution for the stationary time signal from one or both of (1) a first set of one or more portions of the stationary time signal that temporally precede the event, and (2) a second set one or more portions of the stationary time signal that temporally follow the event;
determine an estimated event height of the event based on the stationary time signal and the estimated noise contribution for the stationary time signal; and
determine, based on the estimated event height, an energy of the X-ray photon or electron detected by the detector.

18. The system of claim 17, wherein the instructions further cause the system to perform a sparsification operation on the stationary time signal that causes the event to be temporally compressed such that more samples are available for estimating noise contribution between events.

19. The system of claim 17, wherein the detector is a silicon drift detector configured to detect X-ray photons.

20. The system of claim 17, wherein the instructions further cause the system to determine, based on the energy of the X-ray photon or electron detected by the detector, an element that emitted the X-ray photon or electron detected by the detector.

* * * * *